(12) United States Patent
Subramaniam et al.

(10) Patent No.: US 7,346,465 B1
(45) Date of Patent: Mar. 18, 2008

(54) METHOD OF TESTING THE OBJECTS IN A SET TO OBTAIN AN INCREASED LEVEL OF QUALITY

(75) Inventors: Subbah Rao Subramaniam, Melaka (MY); Tan Tiang Chuan, Melaka (MY); Colin Ong Li Shen, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 252 days.

(21) Appl. No.: 11/140,333

(22) Filed: May 27, 2005

(51) Int. Cl.
*G01N 37/00* (2006.01)
(52) U.S. Cl. .......................................... 702/82; 702/81

(58) Field of Classification Search .................. 702/81, 702/82
See application file for complete search history.

(56) References Cited

U.S. PATENT DOCUMENTS 7,171,335 B2 * 1/2007 Liu et al. ..................... 702/182

* cited by examiner

*Primary Examiner*—John Barlow
*Assistant Examiner*—Stephen J. Cherry
(74) *Attorney, Agent, or Firm*—Mark C. Pickering

(57) ABSTRACT

A method performs quality control testing on the objects in a set of objects to obtain a level of quality. The method identifies a number of objects that satisfy the static testing limits, determines statistical measures from the number of objects, determines a dynamic range of values from the statistical measures, and then identifies the objects that satisfy the dynamic range of values.

14 Claims, 4 Drawing Sheets

METHOD OF TESTING THE OBJECTS IN A SET TO OBTAIN AN INCREASED LEVEL OF QUALITY

BACKGROUND OF THE INVENTION

1. Field of the Invention

The present invention relates to quality control testing and, more particularly, to a method of testing the objects in a set to obtain an increased level of quality.

2. Description of the Related Art

A manufacturing line commonly ends with a quality control review where the object being manufactured is checked to ensure that the object falls within accepted limits. The quality control review can be as simple as a visual inspection of a metal stamping, or as complex as the testing of a semiconductor die.

Whenever testing is involved in a quality control review, a range of acceptable test results must be determined. For example, the range of acceptable test results can be defined by a specification, such as 1 mV ±10%, or derived from specified limits. Once the range has been determined, the range does not change and becomes static.

Thus, when each object in a set of manufactured objects is tested, the result is compared to a static range of values that represents the test results which are acceptable. When the result falls within the static range of values, which is bounded by a static low limit and a static high limit, the object passes the test.

Another aspect of quality that is not typically measured on the manufacturing floor is reliability or, stated in another way, how long an object will continue to operate within the specified limits. In some industries, such as semiconductors, the operational lifetimes of a few of the die that pass the static testing are considerably shorter than permitted. This, in turn, can lead to expensive service calls.

Thus, to improve the overall quality of the manufactured objects, there is a need for a method of identifying objects which will have unacceptably shorter lifetimes, and remove these objects from inventory before they are delivered as manufactured objects.

DETAILED DESCRIPTION OF THE INVENTION

Figure 1:
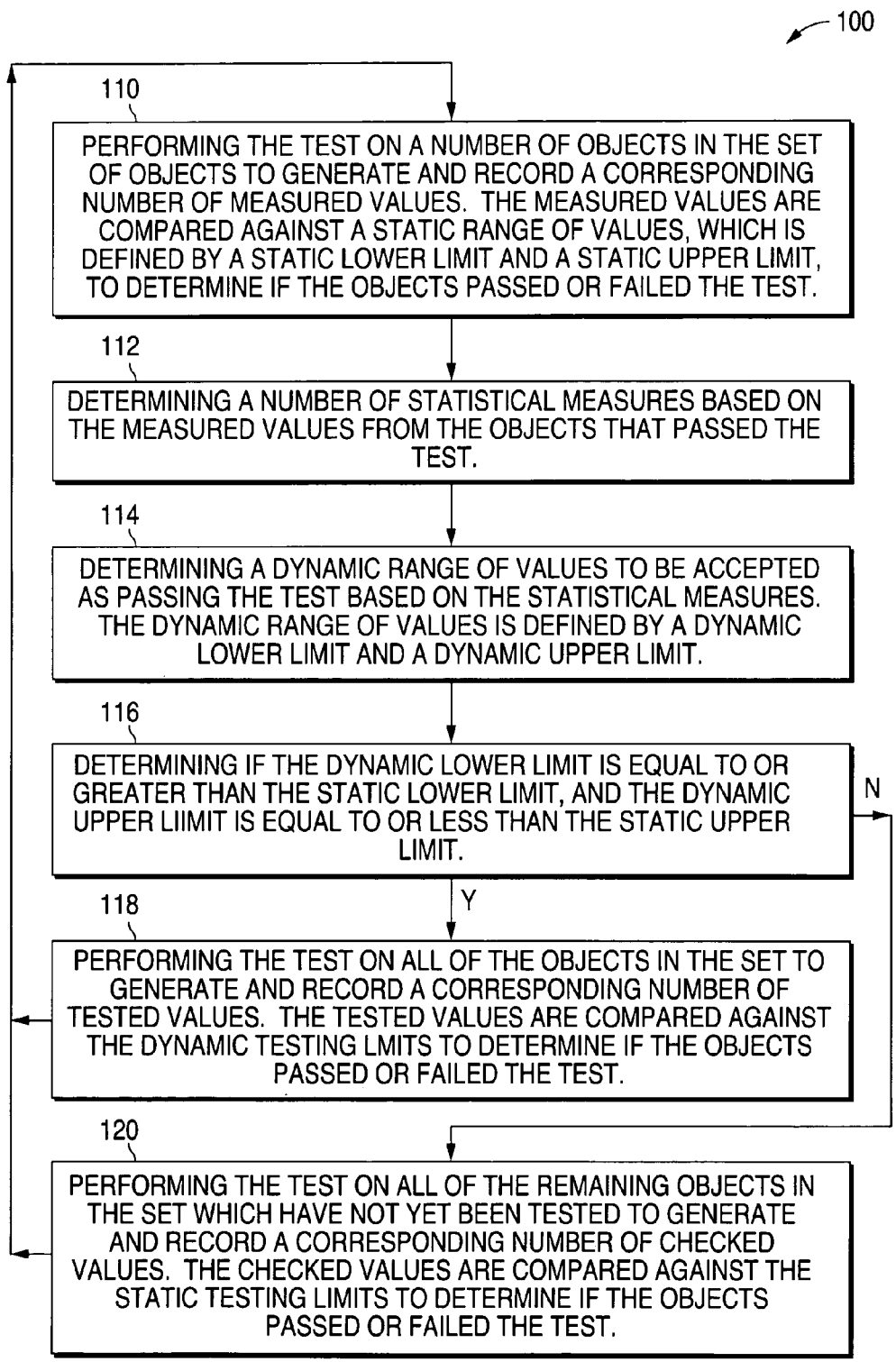
FIG. 1 is a flow chart illustrating an example of a method 100 of testing the objects in a set of objects in accordance with the present invention.

FIG. 1 shows a flow chart that illustrates an example of a method 100 of testing the objects in a set of objects in accordance with the present invention. As described in greater detail below, the present invention can utilize six (6) sigma testing limits in lieu of static testing limits to provide a virtual zero defects approach to quality.

Prior to beginning method 100, an object and a test to be performed on the object must be identified. In addition, the static testing limits for the test must be defined, and can be done so in a conventional fashion. For example, the static testing limits for a test can be defined by a specification, such as 1 mV ±10%, or can be derived from specified limits.

As shown in FIG. 1, method 100 begins at 110 by performing the test on a number of objects in the set of objects to generate and record a corresponding number of measured values. The measured values are compared against a static range of values, which is defined by a static lower limit, e.g., 1 mV −10%, and a static upper limit, e.g., 1 mV +10%, to determine if the objects passed or failed the test. The measured values that fall within the static range of values pass the test, while the values that fall outside of the range fail the test.

For example, in a wafer test environment, a wafer may have 5,000 die that form a set of objects. From this number, a percentage, such as 4% or 200 die, can be randomly selected to be tested. The results are then compared against the static range of values to determine the number of die that passed the test and the number of die that failed the test.

Figure 2:
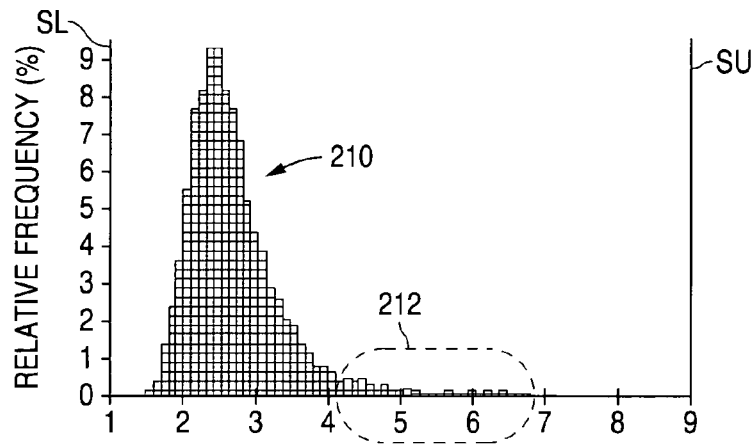
FIG. 2 is a histogram illustrating an example of the results of testing a number of objects from the set of objects in accordance with the present invention.

FIG. 2 shows a histogram that illustrates an example of the results of testing a number of objects from the set of objects in accordance with the present invention. As shown in FIG. 2, all of the objects with measured values that fall within the static range of values defined by a static lower limit SL of 1.0 and a static upper limit SU of 9.0 are plotted.

Of all of the measured values that are plotted, most of the objects are typical objects 210 that have measured values that are similar and fall within a relatively steep-sided bell curve, while a few objects are outlier objects 212 that have measured values that are often isolated and differ substantially from the typical objects 210. When outlier objects 212 exist, the distribution is skewed in the direction of the outlier objects 212.

Referring again to FIG. 1, once the measured values have been determined, method 100 moves to 112 to determine a number of statistical measures based on the measured values from the objects that passed the test. For example, the average or mean measured value can be determined, along with the standard deviation.

Figure 3:
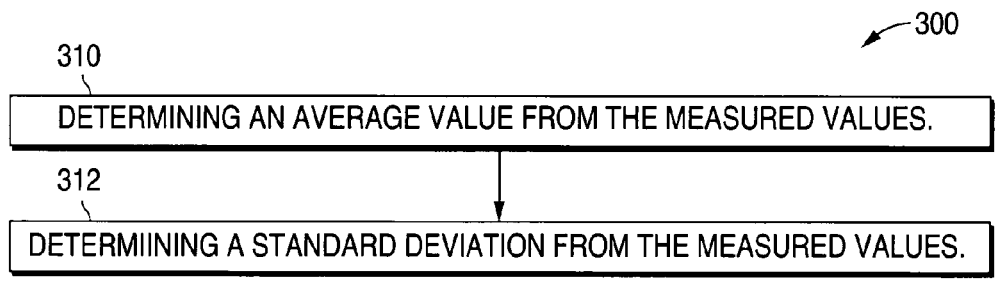
FIG. 3 is a flow chart illustrating an example of a method 300 of determining statistical measures in accordance with the present invention.

FIG. 3 shows a flow chart that illustrates an example of a method 300 of determining statistical measures in accordance with the present invention. As shown in FIG. 3, method 300 begins at 310 by determining an average or mean value from the measured values that satisfied the static testing limits.

For example, if 200 die are tested and 190 of the die pass the test (fall within the static range of values), then an average or mean value can be determined from the 190 die that passed the test. Following this, method 300 moves to 312 to determine a standard deviation from the mean value and the measured values that satisfied the static testing limits.

Returning to FIG. 1, after the statistical measures have been determined, method 100 moves to 114 to determine a dynamic range of values to be accepted as passing the test based on the statistical measures. The dynamic range of values is defined by a dynamic lower limit and a dynamic upper limit.

Figure 4:
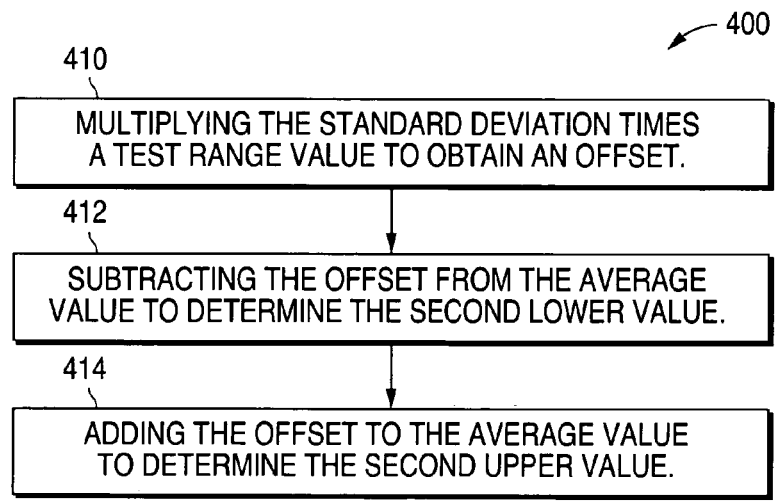
FIG. 4 is a flow chart illustrating an example of a method 400 of determining a dynamic range of values in accordance with the present invention.

FIG. 4 shows a flow chart that illustrates an example of a method 400 of determining a dynamic range of values in accordance with the present invention. As shown in FIG. 4, method 400 begins at 410 by multiplying the standard deviation times a test range value to obtain an offset. For example, to obtain six (6) sigma accuracy, a test range value of three is utilized.

Once the offset has been determined, method 400 moves to 412 to subtract the offset from the average value to determine the dynamic lower limit. Following this, method 400 moves to 414 to add the offset to the average value to determine the dynamic upper limit. As a result, when a test range value of three is utilized, the dynamic lower limit is three sigma below the average or mean value, while the dynamic upper limit is three sigma above the average or mean value. Thus, a six (6) sigma range of values can be obtained by utilizing a test range value of three.

Referring again to FIG. 1, once the dynamic lower and upper limits of the dynamic range of values have been determined, method 100 moves to 116 to determine if the dynamic lower limit is equal to or greater than the static lower limit, and the dynamic upper limit is equal to or less than the static upper limit.

When the dynamic lower limit is equal to or greater than the static lower limit, and the dynamic upper limit is equal to or less than the static upper limit, method 100 moves to 118 to perform the test on all of the objects in the set to generate and record a corresponding number of tested values.

The tested values are compared against the dynamic testing limits to determine if the objects passed or failed the test. In other words, each tested value that falls within the dynamic range of values defined by the dynamic lower and upper limits passes the test, while each tested value that falls outside of the dynamic range of values fails the test.

Figure 5:
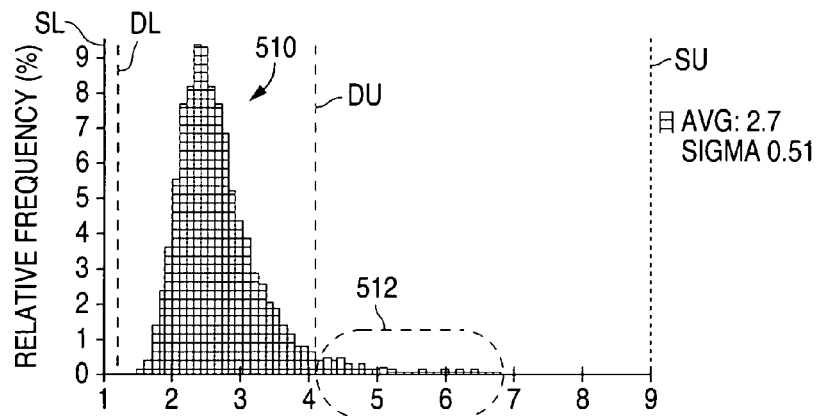
FIG. 5 is a histogram illustrating an example of the results of testing all of the objects from the set in accordance with the present invention.

FIG. 5 shows a histogram that illustrates an example of the results of testing all of the objects from the set in accordance with the present invention. As shown in FIG. 5, all of the objects with tested values that fall within the static range of values defined by a static lower limit SL of 1.0 and a static upper limit SU of 9.0 are plotted. The results produce an average or mean value of 2.7 and a standard deviation of 0.51. In the present example, a three sigma offset produces a dynamic range of values defined by a dynamic lower limit DL of 1.17 and a dynamic upper limit DU of 4.23.

As before, of all of the values that are plotted, most of the objects are typical objects 510 that have tested values that are similar and fall within a relatively steep-sided bell curve, while a few objects are outlier objects 512 that have tested values that differ substantially from the tested values of the other objects.

Even though the tested values of the outlier objects 512 fall within the static range of values, the outlier objects 512 are considered to have abnormal characteristics when compared to the typical objects 510. For example, the outlier objects 512 can suffer from reliability problems that cause the outlier objects 512 to fail prematurely once in the field.

In accordance with the present invention, as shown in FIG. 5, the typical objects 510 that have similar tested values fall within the dynamic range of values and thereby pass the test, while the outlier objects 512 fall outside of the dynamic range of values and thereby fail the test. Thus, the present invention allows deviant objects to be removed, even if the tested values of the deviant objects fall within the static range of values.

Referring again to FIG. 1, on the other hand, when the dynamic lower limit is less than the static lower limit, or the dynamic upper limit is greater than the static upper limit, method 100 moves to 120 to perform the test on all of the remaining objects in the set which have not yet been tested to generate and record a corresponding number of checked values.

The checked values are compared against the static testing limits to determine if the objects passed or failed the test. In other words, each checked value that falls within the static range of values defined by the static lower and upper limits passes the test. Thus, whenever the dynamic range of values exceeds an endpoint of the static range of values, the remaining objects in the set are tested against the static testing limits.

Once all of the objects in the set of objects have been tested in 118 or 120, method 100 returns to 110 to re-determine the dynamic range of values for the next set of objects to be tested. Re-determining the values for each set of objects eliminates any drift due to process variation that can occur from set to set. In addition, before returning to 110, method 100 can store and/or output data regarding the test, such as the dynamic testing limits, for subsequent tracing and/or statistical analysis.

Figure 6A:
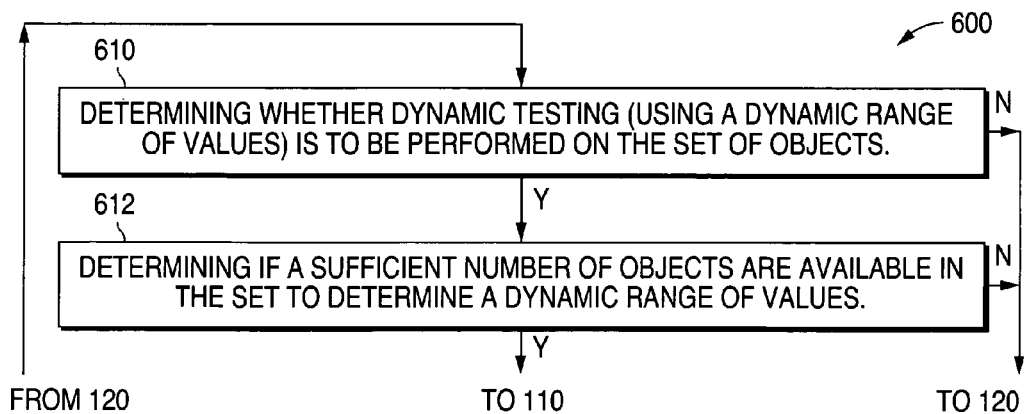
FIGS. 6A-6B are a flow chart illustrating an example of a method 600 of testing the objects in a set of objects in accordance with the present invention.
Figure 6B:
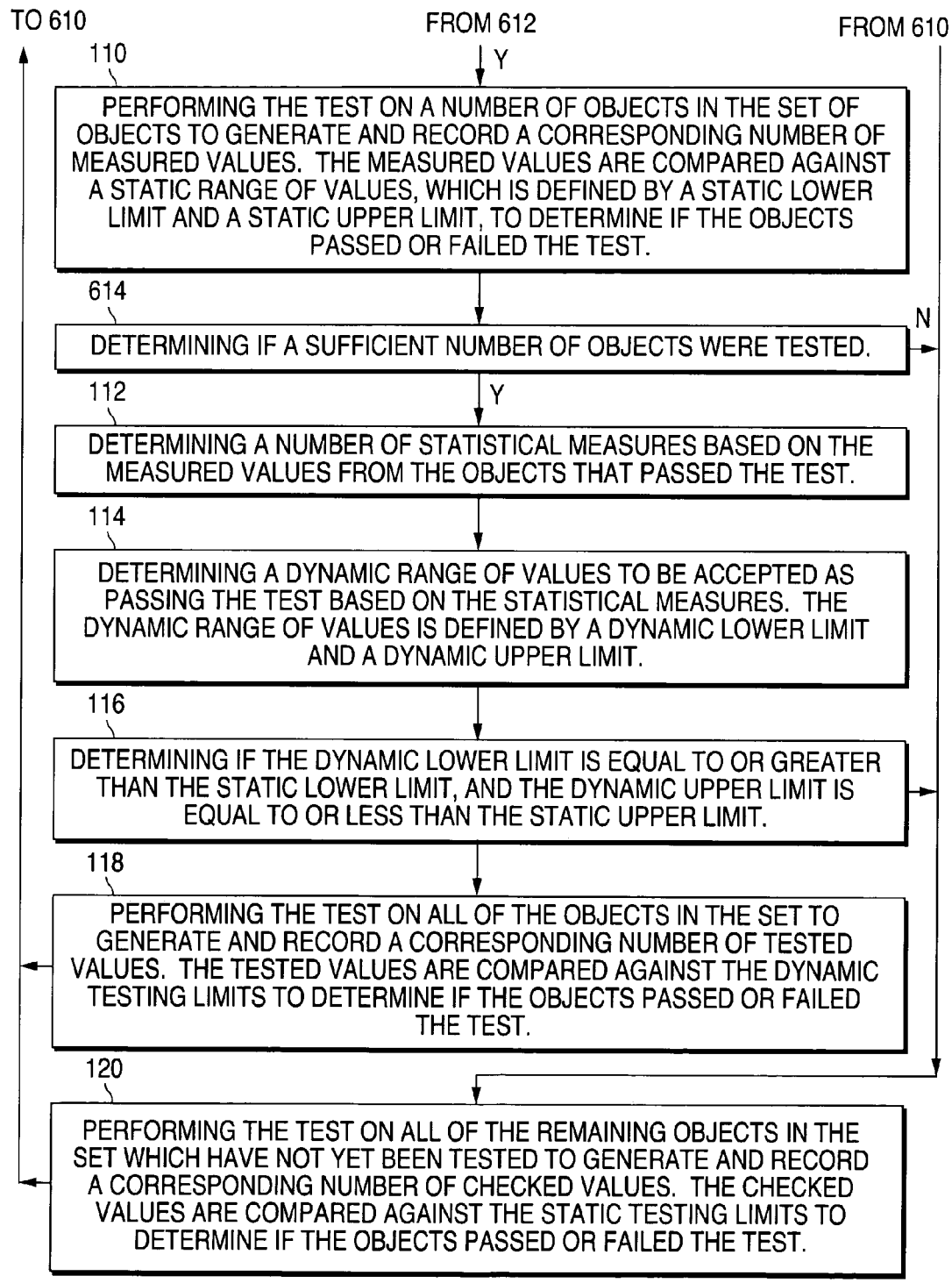

FIGS. 6A-6B show a flow chart that illustrates an example of a method 600 of testing the objects in a set of objects in accordance with the present invention. Method 600 is similar to method 100 and, as a result, utilizes the same reference numerals to designate the elements which are common to both methods.

As shown in FIGS. 6A-6B, method 600 differs from method 100 in that method 600 also includes 610 where, before performing the test in 110, a determination is made as to whether dynamic testing (using a dynamic range of values) is to be performed on the set of objects. For example, in a wafer test environment, a new wafer map is generated and method 600 determines at 610 whether dynamic testing is to be performed by checking the wafer map.

Following this, when dynamic testing is to be performed, method 600 moves to 612 to determine if a sufficient number of objects are available in the set to determine a dynamic range of values. For example, if only 10 good semiconductor die are realized from a fabrication process, the number of objects in the set is insufficient to generate a statistically meaningful result.

When a sufficient number of objects are available, method 600 moves to 110 to test a number of objects in the set of objects as described above. On the other hand, when dynamic testing is not to be performed in 610, or a sufficient number of objects are not available in 612, method 600 moves to 120 to test the objects using the static testing limits.

Method 600 also differs from method 100 in that method 600 moves to 614 before determining statistical measures in 112 to determine if a sufficient number of objects were tested. Even though a sufficient number of objects are available to be tested as determined in 612, interrupted testing, such as due to power failures, can cause test data to be lost, thereby causing an insufficient number of objects to be tested.

If a sufficient number of objects from the set of objects were tested in 614, method 600 moves to 112 to determine the statistical measures as described above. On the other hand, if an insufficient number of objects were tested, method 600 moves to 120 to test the objects using the static testing limits.

In a semiconductor environment, the testing using the static testing limits or the dynamic testing limits can be performed using commercially available automatic test equipment (ATE), such as the Eagle Test System manufactured by Eagle Test Systems, Inc. ATE systems that allow user programmability can be programmed to implement methods 300 and 400.

Figure 7:
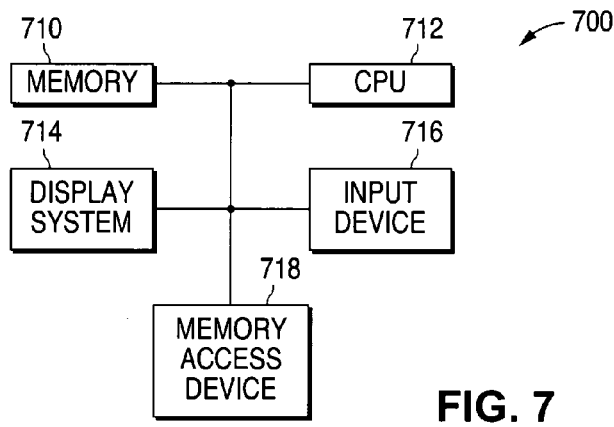
FIG. 7 is a block diagram illustrating an example of a computer 700 in accordance with the present invention.

Alternately, methods 300 and 400 can be implemented with a computer. FIG. 7 shows a block diagram that illustrates an example of a computer 700 in accordance with the present invention. Computer 700, which can be implemented with, for example, a Pentium4 3.4 GHz or comparable machine, can be used to execute a sequence of instructions that implements methods 300 and 400 of the present invention.

As shown in FIG. 7, computer 700 includes a memory 710 and a central processing unit (CPU) 712 that is connected to memory 710. Memory 710 stores data, an operating system, and a set of program instructions. The operating system can be implemented with, for example, the Linux operating system, although other operating systems can alternately be used. The program instructions can be written in, for example, C++ although other languages can alternately be used.

CPU 712, which can be implemented with, for example, a 32-bit processor, operates on the data in response to the program instructions. Although only one processor is described, the present invention can be implemented with multiple processors in parallel to increase the capacity to process large amounts of data.

In addition, computer 700 can include a display system 714 that is connected to CPU 712. Display system 714, which can be remotely located, allows images to be displayed to the user which are necessary for the user to interact with the program. Computer 700 also includes a user-input system 716 which is connected to CPU 712. Input system 716, which can be remotely located, allows the user to interact with the program.

Further, computer 700 includes a memory access device 718, such as a disk drive or a networking card, which is connected to memory 710 and CPU 712. Memory access device 718 allows the processed data from memory 710 or CPU 712 to be transferred to a computer-readable medium or a networked computer. In addition, device 718 allows the program instructions an data to be transferred to memory 710 from the computer-readable medium or networked computer.

In an alternative embodiment, hardware circuitry may be used in place of or in combination with software instructions to implement an embodiment of the present invention. As a result, the present invention is not limited to any specific combination of hardware circuitry and software.

Thus, the present invention provides a method of testing the objects in a set of objects while still on the manufacturing floor or in the assembly area to obtain an increased level of quality, such as a six sigma quality level, that significantly improves the reliability of the manufactured objects.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of testing objects in a set of objects with a test, a first range of values being accepted as passing the test, the first range of values being defined by a first lower limit and a first upper limit, the method comprising:

performing the test on a plurality of objects from the set to generate and record a corresponding plurality of measured values;

comparing the measured values against the first range of values to determine if the objects passed or failed the test;

determining statistical measures based on the measured values, the statistical measures being based on the measured values from the objects that passed the test, determining a statistical measure including:

determining an average value from the measured values; and determining a standard deviation from the measured values; and determining a second range of values to be accepted as passing the test based on the statistical measures, the second range of values having a second lower limit and a second upper limit.

2. The method of claim 1 wherein determining the second range of values includes:

multiplying the standard deviation times a test range value to obtain an offset;

subtracting the offset from the average value to determine the second lower value; and adding the offset to the average value to determine the second upper value.

3. The method of claim 1 and further comprising determining if the second lower limit is equal to or greater than the first lower limit, and the second upper limit is equal to or less than the first upper limit.

4. The method of claim 3 and further comprising performing the test on all of the objects in the set to generate and record a corresponding number of tested values when the second lower limit is equal to or greater than the first lower limit, and the second upper limit is equal to or less than the first upper limit.

5. The method of claim 4 and further comprising comparing the tested values against the second range of values to determine if the objects passed or failed the test.

6. The method of claim 5 and further comprising re-determining the second range of values for each set of objects tested.

7. The method of claim 3 and further comprising performing the test on remaining objects in the set to generate and record a corresponding number of checked values when the second lower limit is less than the first lower limit, or the second upper limit is greater than the first upper limit.

8. The method of claim 7 and further comprising comparing the checked values against the static range of values to determine if the objects passed or failed the test.

9. A method of testing objects in a set of objects with a test, a first range of values being accepted as passing the test, the first range of values being defined by a first lower limit and a first upper limit, the method comprising:

performing the test on a plurality of objects from the set to generate and record a corresponding plurality of measured values;

determining statistical measures based on the measured values, determining a statistical measure including:

determining an average value from the measured values; and determining a standard deviation from the measured values; and determining a second range of values to be accepted as passing the test based on the statistical measures, the second range of values having a second lower limit and a second upper limit, determining the second range of values including:

multiplying the standard deviation times a test range value to obtain an offset;

subtracting the offset from the average value to determine the second lower value; and adding the offset to the average value to determine the second upper value.

10. A method of testing objects in a set of objects with a test, a first range of values being accepted as passing the test, the first range of values being defined by a first lower limit and a first upper limit, the method comprising:

performing the test on a plurality of objects from the set to generate and record a corresponding plurality of measured values;

determining statistical measures based on the measured values;

determining a second range of values to be accepted as passing the test based on the statistical measures, the second range of values having a second lower limit and a second upper limit;

determining if a second range of values is to be determined for the set of objects before performing the test; and determining if sufficient objects are available in the set to determine a second range of values when a second range of values is to be determined.

11. The method of claim 10 and further comprising determining if a sufficient number of objects were tested before determining statistical measures.

12. The method of claim 11 and further comprising testing the objects in the set using the first range of values when an insufficient number of objects were tested.

13. A machine-readable medium having stored thereon sequences of instructions, the sequences of instructions including instructions which, when executed by a processor, causes the processor to perform:

determining statistical measures based on a plurality of measured values that represent results of a test taken on a corresponding plurality of objects, the plurality of measured values including values which fall within a first range of values that are accepted as passing the test, the first range of values having a first low limit and a first high limit, determining a statistical measure including:

determining an average value from the measured values from the objects that passed the test; and determining a standard deviation from the measured values from the objects that passed the test;

comparing the measured values against the first range of values to determine if the objects passed or failed the test; and determining a second range of values to be accepted as passing the test based on the statistical measures, the second range of values having a second low limit and a second high limit.

14. The machine-readable medium of claim 13 wherein determining the second range of values includes:

multiplying the standard deviation times a test range value to obtain an offset;

subtracting the offset from the average value to determine the second lower value; and adding the offset to the average value to determine the second upper value.

* * * * *